(12) United States Patent
Plotz et al.

(10) Patent No.: US 6,357,032 B1
(45) Date of Patent: Mar. 12, 2002

(54) METHOD AND APPARATUS FOR IMPLEMENTING CYCLIC REDUNDANCY CHECK CALCULATION FOR DATA COMMUNICATIONS

(75) Inventors: Kevin Gerard Plotz, Byron; Albert Alfonse Slane, Oronoco, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/246,363

(22) Filed: Feb. 8, 1999

(51) Int. Cl.[7] ............................................... H03M 13/00
(52) U.S. Cl. ....................................... 714/758; 370/229
(58) Field of Search ................................. 714/758, 776, 714/757, 57, 4, 47, 749; 370/352, 395, 419, 474, 503, 230, 443, 461, 465, 349, 397, 471, 229; 709/231, 238, 245, 229, 226; 705/412; 700/11, 286, 9; 340/825

(56) References Cited

U.S. PATENT DOCUMENTS

| | | | | |
|---|---|---|---|---|
| 5,537,403 A | * | 7/1996 | Cloonan et al. | 370/352 |
| 5,568,477 A | * | 10/1996 | Galand et al. | 370/229 |
| 5,740,075 A | * | 4/1998 | Bigham et al. | 709/229 |
| 5,878,057 A | * | 3/1999 | Maa | 714/757 |
| 5,953,344 A | * | 9/1999 | Dail et al. | 370/443 |
| 6,122,759 A | * | 9/2000 | Ayanoglu et al. | 714/57 |
| 6,167,049 A | * | 12/2000 | Pei et al. | 370/395 |
| 6,167,389 A | * | 12/2000 | Davis et al. | 705/412 |
| 6,188,699 B1 | * | 2/2001 | Lang et al. | 370/463 |

* cited by examiner

Primary Examiner—Christine T. Tu
Assistant Examiner—Guy Lamarre
(74) Attorney, Agent, or Firm—Joan Pennington

(57) ABSTRACT

A method and apparatus are provided for implementing cyclic redundancy check (CRC) calculation for data communications in a communications system. CRC calculation apparatus includes a CRC tree structure receiving a first CRC input, a data input of N−1 data input bytes; and a length input. The CRC tree structure includes a series of CRC trees. Each of the CRC trees has a seed CRC input, a fixed size data input and provides a CRC result output. The series of CRC trees are arranged in cascade with increasing data size inputs. A multiplexer control logic responsive to the length input selectively couples predefined data input bytes to predefined ones of the series of the CRC trees. The multiplexer control logic responsive to the length input couples the first CRC input to a selected one of the CRC trees; couples predefined CRC result outputs to predefined ones of the CRC trees; and utilizes a selected CRC tree to provide the overall CRC result.

12 Claims, 4 Drawing Sheets

METHOD AND APPARATUS FOR IMPLEMENTING CYCLIC REDUNDANCY CHECK CALCULATION FOR DATA COMMUNICATIONS

FIELD OF THE INVENTION

The present invention relates generally to the data processing field, and more particularly, relates to a method and apparatus for implementing cyclic redundancy check calculation with receive data processing for data communications in a communications system.

DESCRIPTION OF THE RELATED ART

An Asynchronous Transfer Mode (ATM) network described in "ATM: Theory and Application" by David E. McDysan and Darren L. Spohn, McGraw-Hill, 1994 is an internationally agreed upon technique for transmission, multiplexing and switching in a broadband network. ATM networks are designed to support the integration of high quality voice, video, and high speed data traffic. ATM networks use fixed size cells as a unit of transmission.

Ethernet is the original and still common name for the communications technique that has been standardized by the IEEE as some of the 802.x standards. 802.3 is the general Ethernet standard and 802.x are the link layer standards covering a variety of speeds.

In the face of emerging proprietary optical transmission protocols, SONET (Synchronous Optical Network) was provided as an open standard for synchronous data transmission on optical media. The standard was approved in 1988 by the predecessor to today's International Telecommunication Union, and in 1989 by the American National Standards Institute. SONET is widely deployed in the US. Using time division multiplexing, SONET works by dividing a fiber transmission path into multiple logical channels called tributaries. A tributary's basic unit of transmission is an STS-1 (synchronous transport signal, level 1) or OC-1 (optical carrier, level 1) signal. STS describes a transmission's signals while in an electrical state, and OC describes the same traffic after being converted into optical signals. STS-1 and OC-1 both operate at 51.84 Mbps. OC-2 is twice as fast, OC-3 is three times as fast, and so on. SONET is based on direct synchronous multiplexing, where separate signals are multiplexed directly into higher speed signals. For example, an OC-12 circuit might carry traffic from four OC-3 links. SONET line rates are currently operating up to OC-192 (9.953 Gbps). This is considerably faster than ATM's maximum current rate of 622 Mbps or Ethernet's current rate of 1 Gbps.

Many network packets, for example, Ethernet packets and ATM AAL5 packets, have Cyclic Redundancy Checks (CRC) across the contents of the packet to help guarantee error free delivery. The transmitter generates the CRC and places it in the packet trailer. The receiver validates that the CRC matches the calculated CRC upon reception. The logic to generate and validate a CRC in each of the above environments is well known. The CRC logic typically is formed using a tree of XOR gates called a CRC tree. The logic takes a seed/residue and some amount data, for example, one or two data bytes and calculates a new CRC. This process is repeated over the entire data set. For serial data streams, the logic is somewhat different.

In Ethernet or in other packet networks, the calculation is simple because the CRC can be accumulated over the received stream with no interruption, and the calculation uses a fixed sized input to the CRC tree. The fixed sized input is some power of two, such as 1, 2, or 4 bytes. The number of input bytes is selected to evenly divide into the possible packet sizes. For example, an Ethernet packet is always mod 4 in length. This allows a single tree to be used.

In ATM, things are different due to the nature of the interleaved cells. The CRC needs to be calculated in a series of steps with one CRC calculation for each cell. The CRC remainder needs to be maintained between cells and used as a seed when the next cell arrives. This process is repeated until the packet is completely transmitted or received. In ATM, the data size is always mod 48 due to the cell payload size. Because the CRC is stored and loaded as state between cells, there is latency involved in the process. Due to this latency, the CRC tree typically takes more bytes as input than a packet network CRC requires. This is done so the CRC can be calculated very quickly to overcome the latency of loading the CRC seed.

When the above environments are combined in a single adapter, problems result. In a communications adapter that supports a Packet over SONET physical bus called POS-PHY both cell based protocols and packet based protocols are supported. In addition to both types of protocols, multiple physicals are attached to the bus. Also multiple cell sizes are supported. In these environments, it is necessary to calculate the CRC with a non-standard number of input bytes. For example, on the POS-PHY bus, packets are time multiplexed between physicals, different amounts of data may be received in different bursts. In some environments, it may be necessary to calculate CRC using different numbers of input bytes to the CRC tree for the same cell.

A different more general method is needed for implementing cyclic redundancy check (CRC) calculation with cell and packet processing for data communications in a communications system. A need exists for a mechanism for implementing cyclic redundancy check (CRC) calculation for use with a variety of modes for communications in a communications system.

SUMMARY OF THE INVENTION

A principal object of the present invention is to provide an improved method and apparatus for implementing cyclic redundancy check (CRC) calculation for data communications in a communications system. Other important objects of the present invention are to provide such method and apparatus for cyclic redundancy check (CRC) calculation for data communications for use with a variety of modes for communications and to provide such method and apparatus that overcome disadvantages of prior art arrangements.

In brief, a method and apparatus are provided for implementing cyclic redundancy check (CRC) calculation for data communications in a communications system. CRC calculation apparatus includes a CRC tree structure receiving a first CRC input, a data input of N−1 data input bytes; and a length input. The CRC tree structure includes a series of CRC trees. Each of the CRC trees has a seed CRC input, a fixed size data input and provides a CRC result output. The series of CRC trees are arranged in cascade with increasing data size inputs. A multiplexer control logic responsive to the length input selectively couples predefined data input bytes to predefined ones of the CRC trees. The multiplexer control logic responsive to the length input couples the first CRC input to a selected one of the CRC trees; and couples predefined CRC result outputs to predefined ones of the CRC trees.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
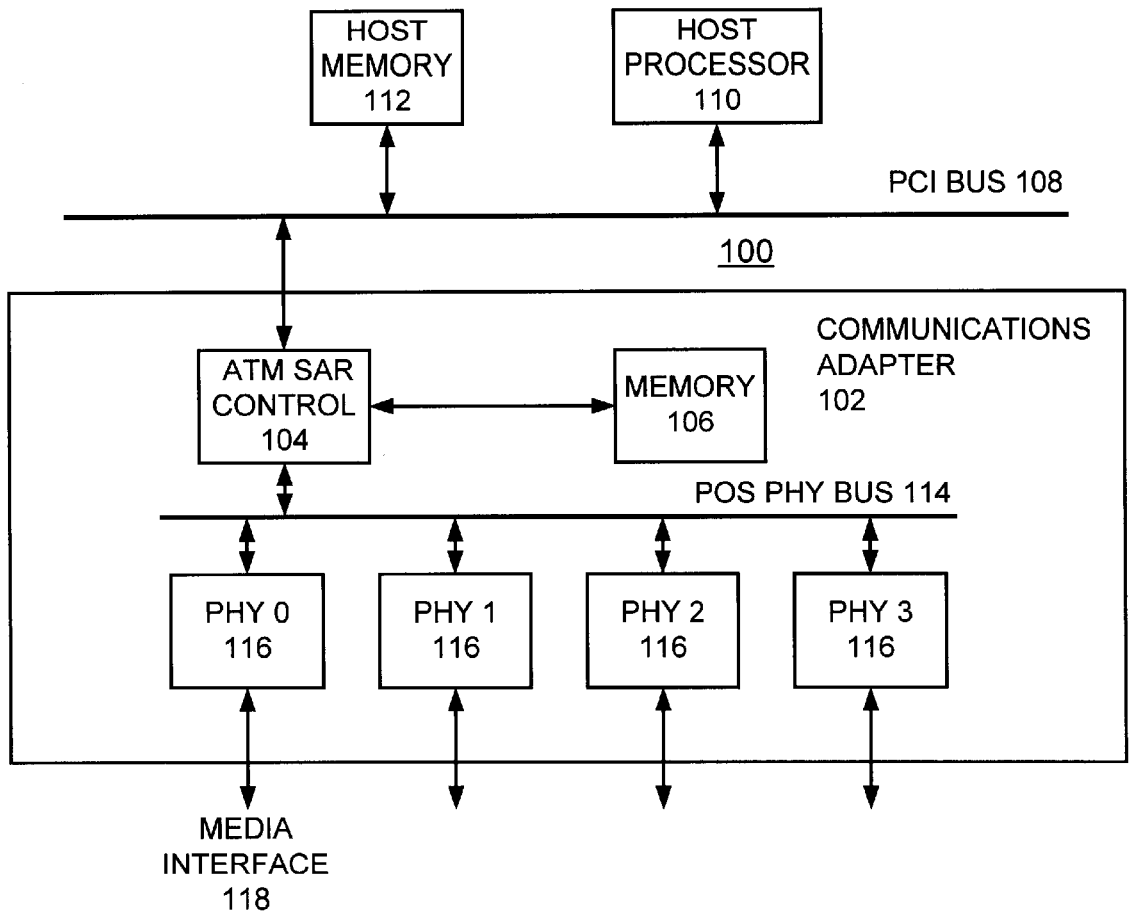
FIG. 1 is a block diagram representation illustrating a communications adapter of the preferred embodiment.

Having reference now to the drawings in FIG. 1, there is shown a communications system generally designated by 100 including a communications adapter generally designated by 102 and arranged in accordance with the preferred embodiment. As shown in FIG. 1, adapter 102 includes an ATM segmentation and reassembly control 104 of the preferred embodiment. The ATM SAR control 104 is coupled to or includes a local memory 106. As shown, the ATM SAR control 104 is connected to a peripheral component interconnect (PCI) bus 108 coupled to a host processor 110 and a host memory 112. The ATM SAR control 104 is connected by a packet over SONET (POS) physical bus 114 to a plurality of physical (PHY) layer 116. Each of the multiple physical layers 116 is connected to a respective media interface 118. Adapter 102 provides interface and translator functions between the PHY layers 116 and the peripheral component interconnect (PCI) bus 108. Adapter 102 includes a transmission logic function (not shown) and a cell scheduler (not shown). Adapter 102 is illustrated in simplified form sufficient for an understanding of the present invention.

Figure 2:
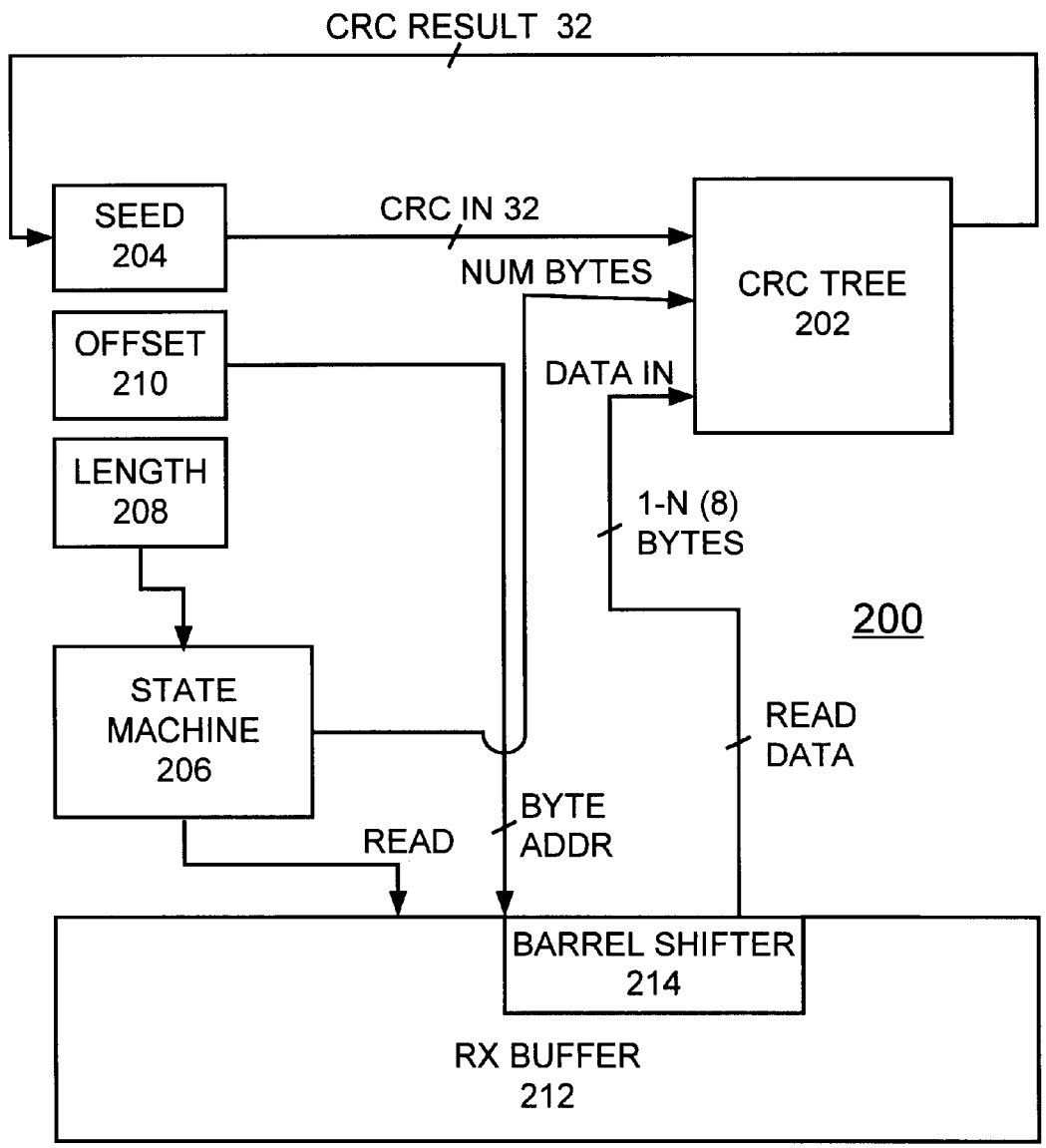
FIG. 2 is a schematic diagram representation illustrating apparatus for implementing cyclic redundancy check (CRC) calculation with receive data processing in the communications adapter of FIG. 1 of the preferred embodiment.

FIG. 2 illustrates apparatus for implementing cyclic redundancy check (CRC) calculation generally designated by 200 included within the ATM SAR control 104 and arranged in accordance with the preferred embodiment. CRC calculation apparatus 200 includes a CRC tree structure 202 of the preferred embodiment. As illustrated and described with respect to FIG. 3, CRC tree structure 202 is formed by a plurality of CRC trees that can use N–1 byte inputs. For example, a variable number from a 1 byte input to an 8 byte (N=8) input may be used.

In accordance with features of the invention, CRC calculation apparatus 200 solves the variable number of inputs problem, allowing a variable number N–1 byte inputs. CRC calculation apparatus 200 is small in terms of required chip area and is fast and easy to implement. CRC calculation apparatus 200 is easy to use and lends itself to program generation.

CRC calculation apparatus 200 includes a seed block 204 receiving a CRC result (31-0). Seed block 204 applies a CRC seed or residue input (31-0) to the CRC tree 202. A state machine 206 receiving a length input from a length block 208 provides a number of bytes (NUM BYTES) or the length input to the CRC tree 202. State machine 206 applies a READ input to a receive (RX) buffer 212 that provides read data DATA IN, (N–1 (8) bytes) to the CRC tree 202. An offset block 210 provides a data byte address (BYTE ADDR) input to a barrel shifter 214 in RX buffer 212. The barrel shifter 214 in RX buffer 212 left aligns all read data, and low bytes are don't cared when left aligned 8 bytes are read.

CRC calculation apparatus 200 uses CRC tree 202 that includes a plurality of cascaded, increasing power of two input CRC trees. In the preferred embodiment, a series of CRC trees with sizes input of 1, 1, 2, 4, 8, . . . are cascaded together with mux control logic to form the flexible (N–1 byte) input CRC tree 202. CRC tree 202 uses multiple smaller trees to selectively form an eventual larger tree, for example as shown in FIG. 3.

Figure 3:
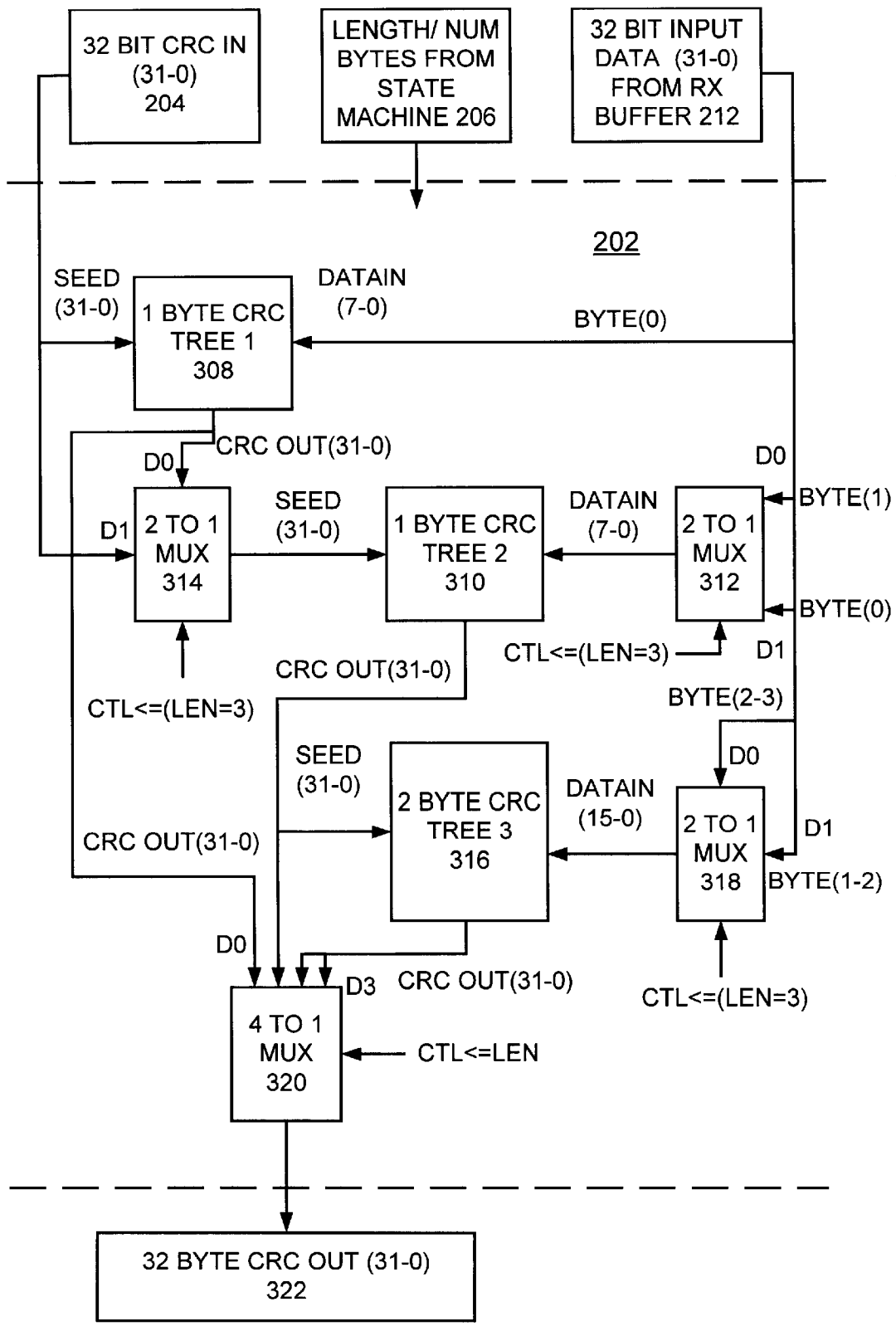
FIG. 3 is a schematic diagram representation illustrating an exemplary CRC tree structure of the apparatus for cyclic redundancy check (CRC) calculation of FIG. 2 of the preferred embodiment.

Referring now to FIG. 3, an exemplary CRC tree 202 is shown. In FIG. 3, CRC tree 202 receives the input 32-bit CRC input 204 (31-0), the number of bytes or LENGTH input from state machine 206, and N–1 data bytes input DATA from RX buffer 212 for each sequential read cycle. An external process loads OFFSET 210, CRC input seed 204, and LENGTH 208 to start the CRC calculation. As shown in FIG. 3, CRC tree 202 provides a 1–4 byte input tree for connections with the illustrated maximum 4 byte or 32-bit input DATA (31-0). It should be understood that the present invention is not limited to the illustrated example.

A first (1 byte) CRC tree 1, 308 receives a Byte(0) data in (7-0) from DATA 306 and receives CRC seed (31-0) from CRC in 302. A second (1 byte) CRC tree 2, 310 receives data in (7-0) of either a Byte (0) data in, D0 or Byte (1) data in, D1 via a first two-to-one multiplexer 312. A second two-to-one multiplexer 314 provides one of the seed CRC input 302 (31-0), D1 or a CRC output (31-0) of the first CRC tree 1 308, D0 to the seed CRC input of CRC tree 2 310. A third (2 byte) CRC tree 316 receives two bytes of data (15-0) DATA IN from a third two-to-one multiplexer 318. D0 input of multiplexer 318 receives data bytes 2–3 and D1 input receives data bytes 1–2. The CRC output (31-0) of the second CRC tree 2, 310 is applied to the seed CRC input of CRC tree 3 316. As shown in FIG. 3, CRC tree 202 includes a four-to-one multiplexer 320 selecting between D0–D3 inputs to provide an overall result 32 byte CRC output (31-0) indicated at a block 322 for the CRC tree 202.

A control input, CTL <=(LEN=3) is applied to each of the two-to-one multiplexers 312, 314, and 318. If true, where LEN=3, then the respective D1 multiplexer input of each multiplexer 312, 314, and 318 is selected. Otherwise, if false, where LEN does not equal 3, then the D0 multiplexer input is selected. A control input, CTL <=LEN is applied to the four-to-one multiplexer 320 to select the CRC output for one of N–1 byte inputs, where N is 4 as shown in FIG. 3.

In the illustrated 1–4 byte inputs of FIG. 3, the CRC output of 1-byte CRC tree 1, 308 is selected for a number of bytes output of state machine 206 or length 208 input of 1. The CRC outputs of 1-byte CRC tree 1, 308 and 1-byte CRC tree 2, 310 are used for the length input of 2. The CRC outputs of 1-byte CRC tree 2 310 and 2-byte CRC tree 3, 316 are used for the length 304 input of 3. The CRC outputs of all the CRC trees 1, 2, 3, 308, 310 and 316 are used for the length 304 input of 4.

CRC tree 202 works because the CRC calculation is a serial process. For example, the CRC is calculated over a series of bytes. The first two stages CRC trees 1 and 2, 308, 310 (both one byte inputs) are equivalent to a single two byte input CRC tree when properly connected, such as shown in FIG. 3. When the third stage CRC tree 3, 316 is added, it becomes equivalent to a 1+1+2=4 byte input CRC tree. This same tree can also be used as a 1, 2, and 3 byte input tree by routing the inputs correctly and selecting the proper CRC output, such as shown in FIG. 3.

It should be understood that CRC tree 202 of the preferred embodiment is not limited to the example shown in FIG. 3. For example, when a fourth stage, four-byte CRC tree is added, CRC tree 202 becomes equivalent to a 1+1+2+4=8 byte input CRC tree. When a fifth stage, eight-byte CRC tree is added, CRC tree 202 becomes equivalent to a 1+1+2+4+8=16 byte input CRC tree. Using current technology, CRC calculation apparatus 200 has, for example, a propagation delay of 3–4 ns. The 1–8 byte CRC tree 202 is also only slightly larger than the equivalent 8 byte input CRC tree, because the biggest tree (4 byte tree) in the series (1+1+2+4) of trees is N/2 the total input size and the tree scale linearly with the number of inputs.

Figure 4:
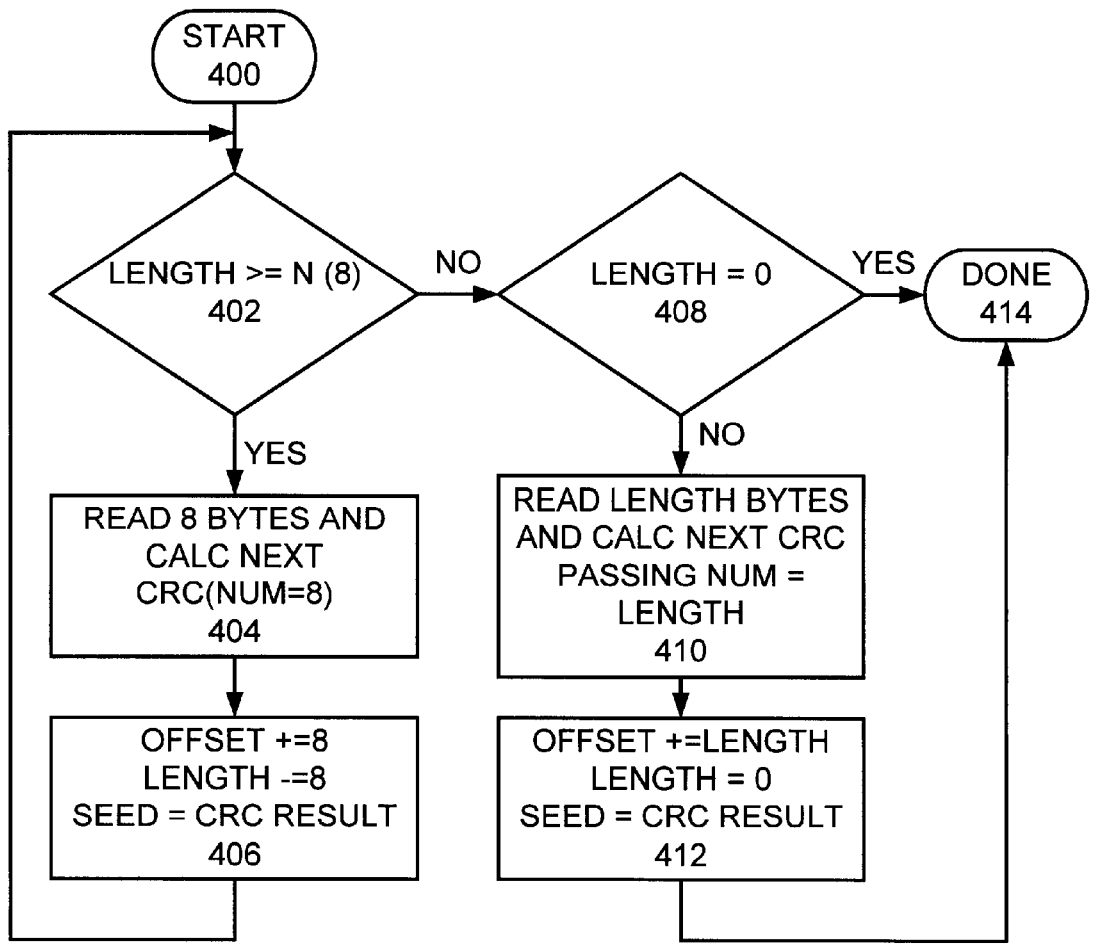
FIG. 4 is a flow chart illustrating exemplary steps performed for CRC calculation by the apparatus for cyclic redundancy check (CRC) calculation of FIG. 2 of the preferred embodiment.

FIG. 4 illustrates exemplary steps performed for CRC calculation by the cyclic redundancy check (CRC) calculation apparatus 200 starting at a block 400. Checking whether the length is greater than or equal to N, for example where N equals 8, is performed as indicated at a decision block 402. When the length is greater than or equal to 8, 8 bytes are read and a next CRC is calculated for the 8 bytes as indicated at a block 404. Then OFFSET 210, LENGTH 208 and SEED 204 are updated as indicated at a block 406. At block 406, the OFFSET 210 is set to OFFSET+8; the length is set to LENGTH−8 and SEED is set to the CRC result, then the sequential operations return to block 402 to continue with a next data read cycle.

Otherwise when the length is not greater than or equal to N, checking for a length equal to zero is performed as indicated at a decision block 408. If the length is not equal to zero, the length number of bytes are read and a next CRC is calculated for the length number of bytes as indicated at a block 410. Then OFFSET 210 is set to OFFSET+LENGTH (the length number of bytes read at block 408); LENGTH is set to zero and SEED is set to the CRC result from block 408 as indicated at a block 412. This completes the sequential CRC calculation operations for the data communication as indicated at a block 414. When the length is equal to zero at decision block 408, this completes the sequential CRC calculation operations.

While the present invention has been described with reference to the details of the embodiments of the invention shown in the drawing, these details are not intended to limit the scope of the invention as claimed in the appended claims.

What is claimed is:

1. Apparatus for implementing cyclic redundancy check (CRC) calculation with transmit and receive data processing for data communications in a communications system comprising:
   a CRC tree structure receiving a first CRC input, a variable number of data input bytes, and a length input and providing an overall CRC result; said CRC tree structure including;
   a series of CRC trees, each of said CRC trees having a seed CRC input, a fixed size data input and providing a CRC result output; said series of CRC trees arranged in cascade with increasing data size inputs; and
   a multiplexer control logic coupled to said CRC tree structure, said multiplexer control logic, responsive to said length input, selectively coupling predefined data input bytes to predefined ones of said CRC trees; selectively coupling said first CRC input to a selected one of said CRC trees; and selectively coupling predefined CRC result outputs to said seed CRC input of predefined ones of said CRC trees.

2. Apparatus for implementing cyclic redundancy check (CRC) calculation with transmit and receive data processing for data communications in a communications system as recited in claim 1 wherein said CRC tree structure receiving said variable number of data input bytes, where said variable number of said data input bytes equals eight, and wherein said series of CRC trees includes said series of four CRC trees arranged in cascade with said increasing data size inputs of one byte, one byte, two bytes and four bytes.

3. Apparatus for implementing cyclic redundancy check (CRC) calculation with transmit and receive data processing for data communications in a communications system as recited in claim 1 wherein said CRC tree structure receiving said variable number of data input bytes, where said variable number of said data input bytes equals eight, and wherein said series of CRC trees includes said series of three CRC trees arranged in cascade with said increasing data size inputs of one byte, one byte, and two bytes.

4. Apparatus for implementing cyclic redundancy check (CRC) calculation with transmit and receive data processing for data communications in a communications system as recited in claim 1 includes a receive buffer storing receive data and applying read data to said CRC tree structure.

5. Apparatus for implementing cyclic redundancy check (CRC) calculation with transmit and receive data processing for data communications in a communications system as recited in claim 4 includes a state machine providing a read control signal to said receive buffer and an offset defining a byte address.

6. Apparatus for implementing cyclic redundancy check (CRC) calculation with transmit and receive data processing for data communications in a communications system as recited in claim 1 wherein said multiplexer control logic, responsive to said length input, selectively couples one predefined CRC result output of a selected one of said series of CRC trees providing said overall CRC result.

7. Apparatus for implementing cyclic redundancy check (CRC) calculation with transmit and receive data processing for data communications in a communications system as recited in claim 1 includes a state machine providing read control signals to a receive buffer storing receive data and wherein said CRC tree structure processes the receive data in a sequence of data read cycles; and in the sequential data read cycles said first CRC input is updated to equal said overall CRC result of a previous data read cycle.

8. Apparatus for implementing cyclic redundancy check (CRC) calculation with transmit and receive data processing for data communications in a communications system as recited in claim 7 wherein said state machine compares a receive data length with said variable number of data input bytes and provides a control signal for applying said variable number of data input bytes of read data to said CRC tree structure responsive to said receive data length being greater than or equal to said variable number of data input bytes.

9. Apparatus for implementing cyclic redundancy check (CRC) calculation with transmit and receive data processing for data communications in a communications system as recited in claim 7 wherein said state machine updates a receive data length value and an offset value with each sequential data read cycle.

10. A method for implementing cyclic redundancy check (CRC) calculation with transmit and receive data processing for data communications in a communications system comprising the steps of:
   utilizing a CRC tree structure formed of a series of CRC trees, each of said CRC trees having a seed CRC input, a fixed size data input and providing a CRC result output; said series of CRC trees arranged in cascade with increasing data size inputs;

applying a first CRC input and a number of data input bytes to said CRC tree structure;

utilizing a multiplexer control logic coupled to said CRC tree structure; said multiplexer control logic responsive to said number of data input bytes applied to said CRC tree structure, for performing the steps of:

applying predefined data input bytes to predefined ones of said CRC trees;

applying said first CRC input to a selected one of said CRC trees;

applying predefined CRC result outputs to said seed CRC input of predefined CRC trees; and utilizing said CRC result output of a selected one of said CRC trees to provide an overall CRC result.

11. The method for implementing cyclic redundancy check (CRC) calculation with transmit and receive data processing for data communications in a communications system as recited in claim 10 wherein the receive data is processed in a sequence of data read cycles; and said overall CRC result of each data read cycle providing said first CRC input for a next sequential data read cycle.

12. The method for implementing cyclic redundancy check (CRC) calculation with transmit and receive data processing for data communications in a communications system as recited in claim 10 wherein the receive data is processed in a sequence of data read cycles and wherein sequential data read cycles include the step of updating said first CRC input equal to said overall CRC result of a previous data read cycle.

* * * * *